US008738974B2

(12) United States Patent
Honda (10) Patent No.: US 8,738,974 B2
(45) Date of Patent: May 27, 2014

(54) NONVOLATILE MEMORY DEVICE AND MEMORY CONTROLLER (75) Inventor: Toshiyuki Honda, Kyoto (JP)

(73) Assignee: Panasonic Corporation, Osaka (JP)

( * ) Notice: Subject to any disclaimer, the term of this patent is extended or adjusted under 35 U.S.C. 154(b) by 457 days.

(21) Appl. No.: 12/870,159

(22) Filed: Aug. 27, 2010

(65) Prior Publication Data

US 2011/0055625 A1 Mar. 3, 2011

(30) Foreign Application Priority Data

Aug. 28, 2009 (JP) .................................. 2009-197826

(51) Int. Cl.
*G06F 11/00* (2006.01)

(52) U.S. Cl.
USPC ................. 714/53; 714/763; 714/752; 713/2; 713/187; 711/103; 711/162

(58) Field of Classification Search
USPC ......... 714/763, 752, 2, 53; 713/187; 711/103, 711/162
See application file for complete search history.

(56) References Cited

U.S. PATENT DOCUMENTS

| 6,377,500 | B1 * | 4/2002 | Fujimoto et al. | ......... 365/230.01 |
| 7,657,697 | B2 | 2/2010 | Oshima | |
| 8,046,542 | B2 * | 10/2011 | Radke | ........................... 711/157 |
| 2004/0117562 | A1 * | 6/2004 | Wu et al. | ..................... 711/147 |
| 2005/0185476 | A1 * | 8/2005 | Tachikawa | ............... 365/189.05 |
| 2006/0075395 | A1 * | 4/2006 | Lee et al. | ..................... 717/168 |
| 2006/0155918 | A1 | 7/2006 | Oshima | |
| 2008/0074928 | A1 * | 3/2008 | Choi | ........................ 365/185.17 |
| 2008/0086631 | A1 * | 4/2008 | Chow et al. | ....................... 713/2 |
| 2008/0094893 | A1 * | 4/2008 | Choi | ........................ 365/185.03 |
| 2008/0162789 | A1 * | 7/2008 | Choi et al. | ..................... 711/103 |
| 2008/0183949 | A1 * | 7/2008 | Ly et al. | ......................... 711/103 |
| 2008/0320342 | A1 * | 12/2008 | Imagawa et al. | ................ 714/53 |
| 2009/0265598 | A1 * | 10/2009 | Lasser | ............................ 714/746 |
| 2010/0082890 | A1 * | 4/2010 | Heo et al. | ..................... 711/103 |
| 2010/0174852 | A1 * | 7/2010 | Chien et al. | ................... 711/103 |
| 2010/0205353 | A1 * | 8/2010 | Miyamoto et al. | ............. 711/103 |
| 2010/0318721 | A1 * | 12/2010 | Avila et al. | ..................... 711/103 |
| 2010/0318839 | A1 * | 12/2010 | Avila et al. | ........................ 714/5 |
| 2011/0208933 | A1 * | 8/2011 | Selfin et al. | .................... 711/162 |

FOREIGN PATENT DOCUMENTS

| JP | 2006-195565 | 7/2006 |
| JP | 2006-221743 | 8/2006 |

* cited by examiner

*Primary Examiner* — Joshua P Lottich
*Assistant Examiner* — Jeison C Arcos
(74) *Attorney, Agent, or Firm* — Wenderoth, Lind & Ponack, L.L.P.

(57) ABSTRACT

The memory controller writes and reads data in and from a nonvolatile memory. The nonvolatile memory has a plurality of memory cell blocks, each memory cell block includes a plurality of multi-level cells each capable of storing m-bit data (m is a natural number of two or more), a first page to a m-th page are allocated to the respective m bits of the multi-level cell, the memory controller sequentially writes the data to the memory cells from the first page in ascending order, and comprises a backup unit, and when a write command is received from the outside of the memory controller, in a case where a data write destination of the data in the nonvolatile memory is a n-th (n is a natural number of two to m) page of the multi-level cell, and data is already written in the first to (n-1)th pages, the backup unit copies the already written data to a nonvolatile storable backup region.

16 Claims, 10 Drawing Sheets

NONVOLATILE MEMORY DEVICE AND MEMORY CONTROLLER

BACKGROUND

1. Technical Field

The technical field relates to a nonvolatile memory device using a nonvolatile memory capable of storing information of two or more bits in one memory cell, and to a memory controller to control the nonvolatile memory.

2. Related Art

Recently, a memory card having a nonvolatile memory has been widely used as memory device for a digital camera and a mobile phone. The memory card is required to have larger capacity so as to be able to correspond to a high pixel density of the digital camera and a usage such as recording of a moving image in the mobile phone. In order to meet the request of high capacity as described above, a multi-level cell has been developed in a memory cell constituting the nonvolatile memory. For example, when the memory cell is binarized, two-bit information can be stored in the one memory cell (hereinafter, this two bits are each referred to as the "bit sharing the memory cell"), so that the capacity of the nonvolatile memory can be double with the same number of memory cells.

However, the following problem arises in the multi-level cell. That is, since data is written to the multi-level cell bit by bit, already written one bit information could be destroyed due to power shutdown and the like occurring while data is written to the bit sharing the memory cell afterwards.

JP-A-2006-221743 and JP-A-2006-195565 disclose a technique to prevent data from being destroyed due to the power shutdown. For example, JP-A-2006-221743 employs a block in which a multi-level cell (four-value memory cell) can be used as a two-value memory cell. Thus, write data is once written to the block in which the multi-level cell can be used as the two-value memory, and copied in a multivalued memory block after a writing data has been correctly completed.

In addition, JP-A-2006-195565 discloses a technique to protect already written data in such a manner that data is not written to the bit which shares a memory cell with the already written data.

However, as for JP-A-2006-221743, since the data is written first in the two-value form and then, copied and written in the multivalued form, a size of the data to be written becomes double, so that a threefold size of the block for the writing is required, which lowers a write performance of the flash memory and deteriorates endurance characteristics.

As for JP-A-2006-195565, since the data is not written to the bit which shares the memory cell with the already written data, the capacity of the flash memory is wasted. In addition, JP-A-2006-195565 substantially has the problem that the data is destroyed due to the memory cell sharing during writing the data.

As described above, although the already written data can be prevented from being erased due to the memory cell sharing even when the power shutdown occurs at the time of writing, the above-described problem still exits in JP-A-2006-221743 and JP-A-2006-195565.

It is an object of the present invention to provide a memory controller capable of preventing already written data from being erased due to memory cell sharing even when power shutdown occurs at the time of writing, without causing the problem occurring in JP-A-2006-221743 and JP-A-2006-195565, in writing data in a nonvolatile memory including multi-level cells, and a nonvolatile memory device provided with the above memory controller.

SUMMARY

According to a first aspect, a memory controller is provided for writing and reading data to and from a nonvolatile memory. In the memory controller, the nonvolatile memory has a plurality of memory cell blocks, each memory cell block includes a plurality of multi-level cells each capable of storing m-bit data (m is a natural number of two or more), a first page to a m-th page are allocated to the respective bit of m bits of the multi-level cell, and the memory controller sequentially writes the data to the memory cells from the first page in ascending order, and comprises a backup unit, and when a write command is received from the outside of the memory controller, in a case where a data write destination of the data in the nonvolatile memory is a n-th (n is a natural number of two to m) page of the multi-level cell, and data is already written in the first to (n-1) th pages, the backup unit copies already written data to a nonvolatile storable backup region.

According to a second aspect, a nonvolatile memory device is provided. The nonvolatile memory device includes the memory controller according to the first aspect, and a nonvolatile memory. Data can be read and written by a command designating an address from a host device provided outside the memory controller.

According to the above aspects, in writing data to the multi-level cell, in the case where a write destination physical address corresponds to the n-th page (n is the natural number of two to m), and the data is already written in the corresponding first to (n-1)th pages, the already written data is copied in the nonvolatile storable backup region. In this configuration, even when a failure such as power shutdown occurs during writing data to the nonvolatile memory including the multi-level cells, the already written data copied in the backup region remains in the backup region. Therefore, the already written data can be recovered from the backup region. As a result, data reliability is improved. In addition, according to this aspect, since the configuration different from that of JP-A-2006-221743 and JP-A-2006-195565 is employed, the problem in JP-A-2006-221743 and JP-A-2006-195565 does not arise.

DETAILED DESCRIPTION OF PREFERRED EMBODIMENT

1. Configuration

A preferred embodiment will be described with reference to the drawings.

Figure 1:
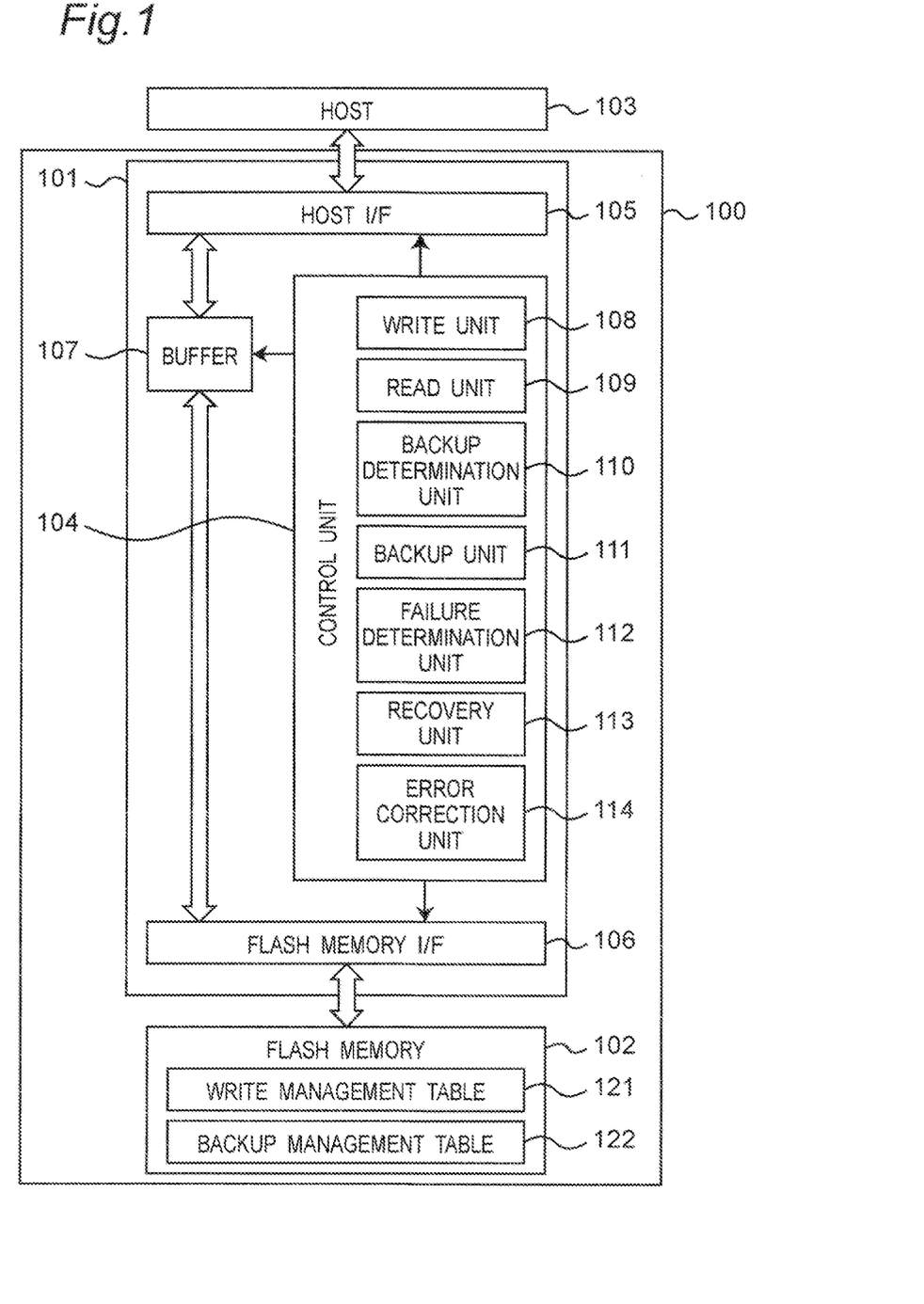
FIG. 1 is a configuration diagram of a nonvolatile memory system.

FIG. 1 shows a configuration of a nonvolatile memory system. The nonvolatile memory system includes a host device 103 and a nonvolatile memory device 100. The host device 103 transmits a command to the nonvolatile memory device 100 to write and read data. The nonvolatile memory device 100 receives the command from the host device 103 and writes and read data. The nonvolatile memory device 100 has a memory controller 101 and a flash memory 102. The nonvolatile memory device 100 is, for example, a memory card.

The memory controller 101 controls the writing and reading of the data for the flash memory 102.

The flash memory 102 is a NAND type nonvolatile memory. In addition, the flash memory 102 is a multivalued memory which can store two-bit data in a memory cell.

The host device 103 writes and reads the data to and from the flash memory 102.

The memory controller 101 has a control unit 104, a host interface (hereinafter, referred to as the "host I/F") 105, a flash memory interface (hereinafter, referred to as the "flash memory I/F") 106, and a buffer 107.

The host I/F 105 controls communication between the memory controller 101 and the host device 103.

The flash memory I/F 106 controls communication between the memory controller 101 and the flash memory 102.

The buffer 107 is provided between the host I/F 105 and the flash memory I/F 106. The buffer 107 temporarily stores the data to be written from the host device 103 to the flash memory 102, and the data to be read from the flash memory 102 to the host device 103.

The control unit 104 controls the memory controller 101. That is, the control unit 104 controls the host I/F 105 and the flash memory I/F 106, and controls writing and reading operations for the flash memory 102.

The control unit 104 includes a write unit 108, a read unit 109, a backup determination unit 110, a backup unit 111, a failure determination unit 112, a recovery unit 113, and an error correction unit 114. The write unit 108 writes the data to the flash memory 102. The read unit 109 reads the data from the flash memory 102. The backup determination unit 110 determines whether backup is needed or not in writing the data to the flash memory 102. The backup unit 111 copies the data to be backed up in a backup block (which will be described below). The failure determination unit 112 detects a failure in writing to the flash memory 102 at the time of power supply. The recovery unit 113 recovers faulty data. The error correction unit 114 detects and corrects a bit error occurring in the flash memory 102.

In addition, the control unit 104 can detect a fact that write data has become faulty due to power shutdown during writing the data to the flash memory 102, by using an error correction function of the error correction unit 114. More specifically, when the write data becomes faulty due to the power shutdown, the error correction cannot be performed. In this case, the error correction unit 114 can detect the fact that the write data has become faulty due to a failure such as the power shutdown.

Figure 2:
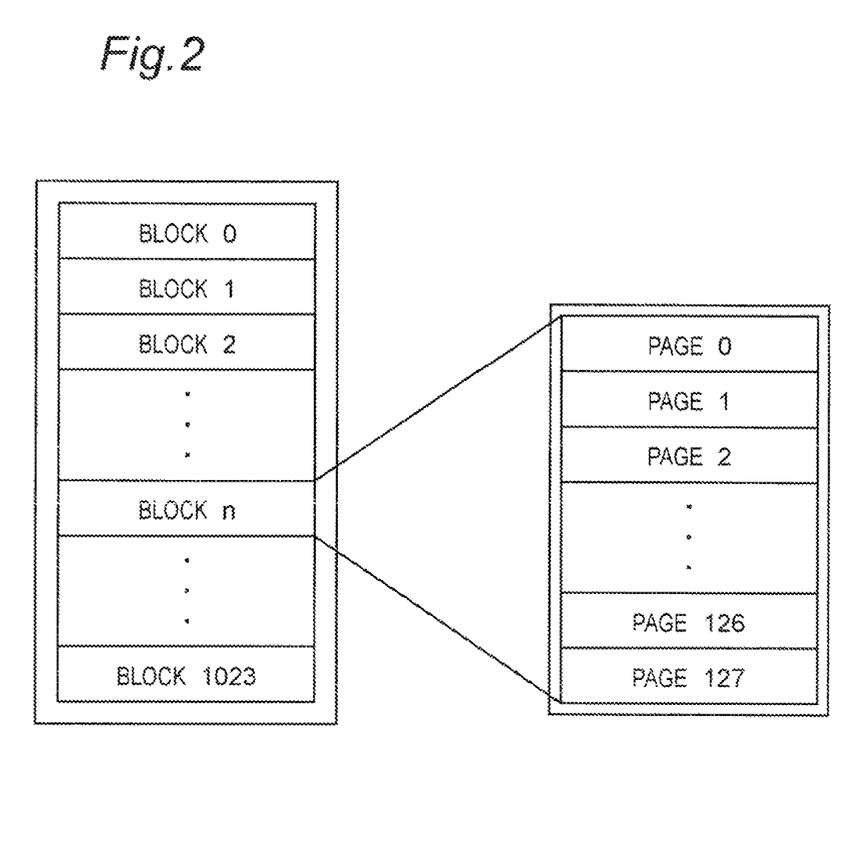
FIG. 2 is a configuration diagram of a memory cell array of a nonvolatile memory used in a nonvolatile memory device.

FIG. 2 shows a configuration of a memory cell array of the flash memory 102.

The flash memory 102 includes a plurality of physical blocks. Here, the flash memory 102 has physical blocks 0 to 1023. The physical block is a unit of erasing data in the flash memory 102. Each block has a plurality of physical pages. Here, each block has 128 pages from page 0 to page 127. The physical page is a unit of writing data to the flash memory 102. In addition, a general NAND type flash memory has a rule that the data writing to each physical page of the physical block has to be performed sequentially from the physical page 0 page by page, and this embodiment also has that rule.

Figure 3:
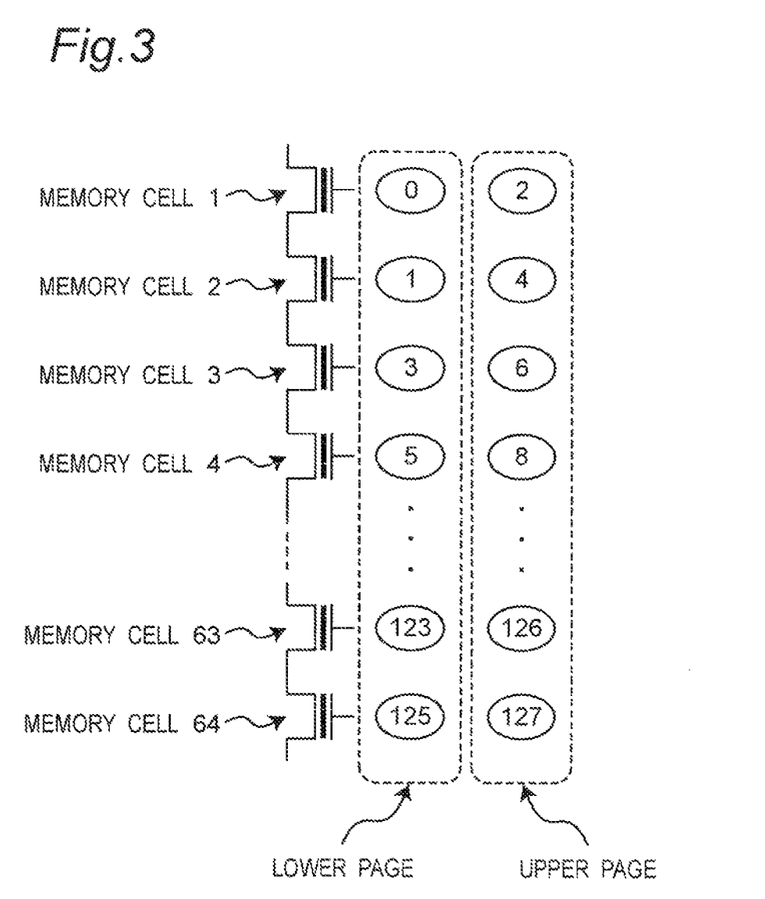
FIG. 3 is a diagram showing physical pages of a multi-level cell of the nonvolatile memory used in the nonvolatile memory device.

FIG. 3 shows a NAND connection state of the multi-level cells belonging to the physical block, and the pages corresponding to the respective multi-level cells, with respect to one bit line. The physical block is configured by laterally arranging configurations shown in FIG. 3 by number required for capacity of the physical pages. Here, two-bit data can be written in each memory cell, and two physical pages are allocated to the one memory cell. On the right side of the multi-level cell in FIG. 3, the numbers of the physical pages allocated to each multi-level cell are shown. The plurality of pages are allocated to each memory cell in such a manner that the pages 0 and 2 are allocated to a memory cell 1, and pages 1 and 4 are allocated to a memory cell 2. In the multi-level cell, the physical page in which the first data is written is called a "lower page" and the physical page in which the next data is written is called an "upper page". When number m in "m-th page" in claims is 2, "lower page" corresponds to "first page" in claims, and "upper page" corresponds to "m-th page" in claims.

Figure 4:
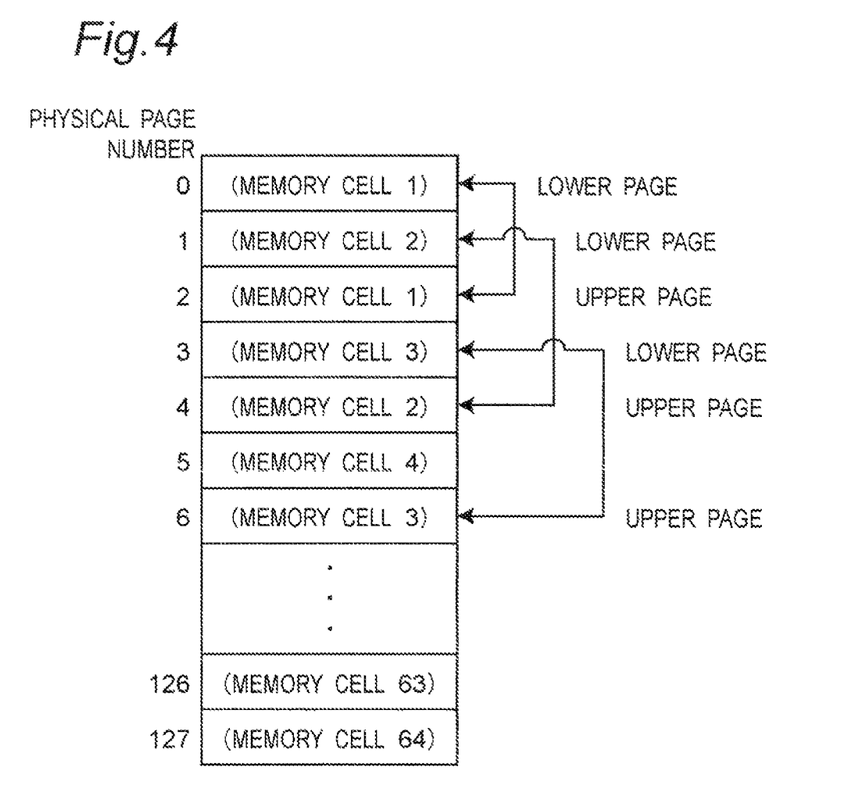
FIG. 4 is a view showing physical pages shared by the nonvolatile memory used in the nonvolatile memory device.

FIG. 4 is a view to explain a relationship between the physical page numbers of the physical pages in the physical block and the pages sharing the multi-level cell. The physical page number is shown on the left side of each physical page. FIG. 4 shows a case where 128 pages from the page 0 to the page 127 exist as the physical pages, and the physical page numbers are shown from 0 to 127 in numerical order. The data has to be written to the physical block in ascending order of the physical page numbers. The pages sharing the memory cell are shown by an arrow line on the right side of the physical pages. For example, the physical page 0 and the physical page 2 share the memory cell 1, and the physical page 1 and the physical page 4 share the memory cell 2, and a physical page 3 and a physical page 6 share a memory cell 3.

The predetermined physical block in the flash memory 102 has a write management table 121 to control a write state in the physical page in the flash memory 102, and a backup management table 122 to control a backup state of the data which will be described below.

2. Operation

Figure 5:
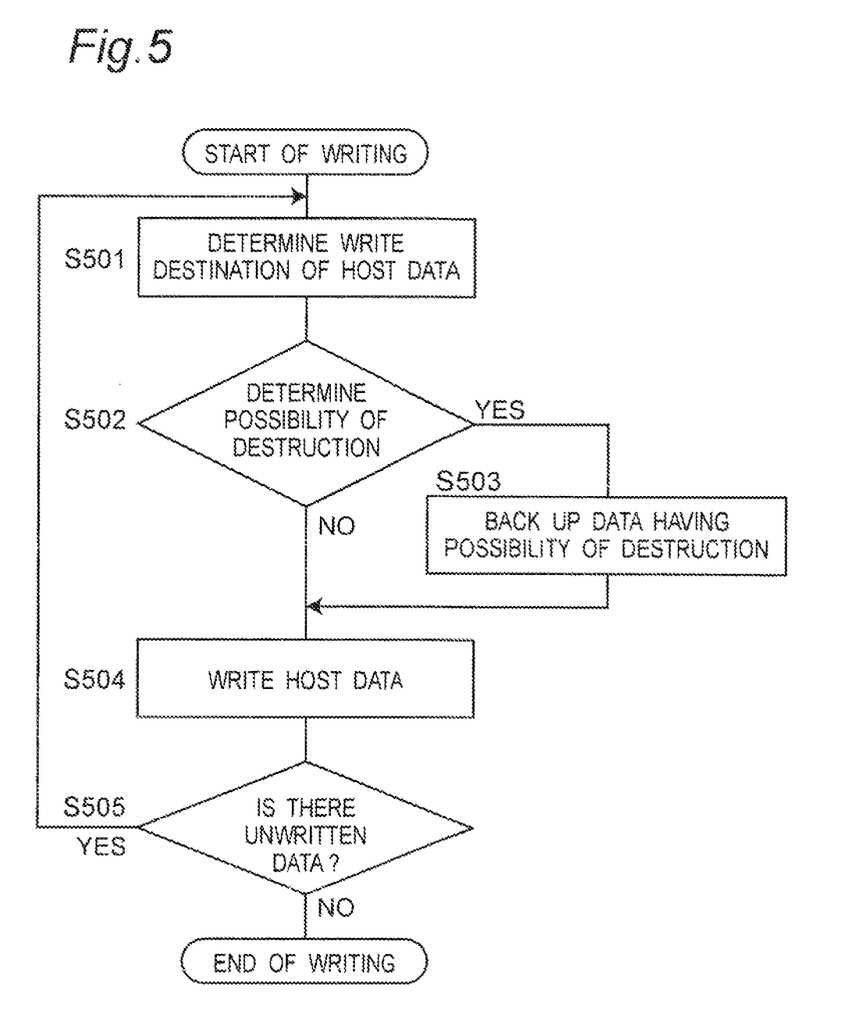
FIG. 5 is a flowchart in writing data in the nonvolatile memory device.

FIG. 5 shows a flowchart of a process of writing data to the flash memory 102 when the memory controller 101 receives a data write command from the host device 103.

First, the control unit 104 of the memory controller 101 determines a physical address in which the data is to be written according to the command received from the host device 103, that is, a write destination physical block and a physical page therein (S501). In writing the data to the flash memory 102, there is a case where the data from the host device 103 is written as it is, and a case where another data is copied to write the data from the host device 103.

Next, in step S502, the backup determination unit 110 determines whether or not there is a possibility that in writing the data to the physical page of the physical block determined in step S501, the data which is written in the flash memory 102 before this writing operation is destroyed (S502). This determination will be described in detail with reference to FIG. 6.

Figure 6:
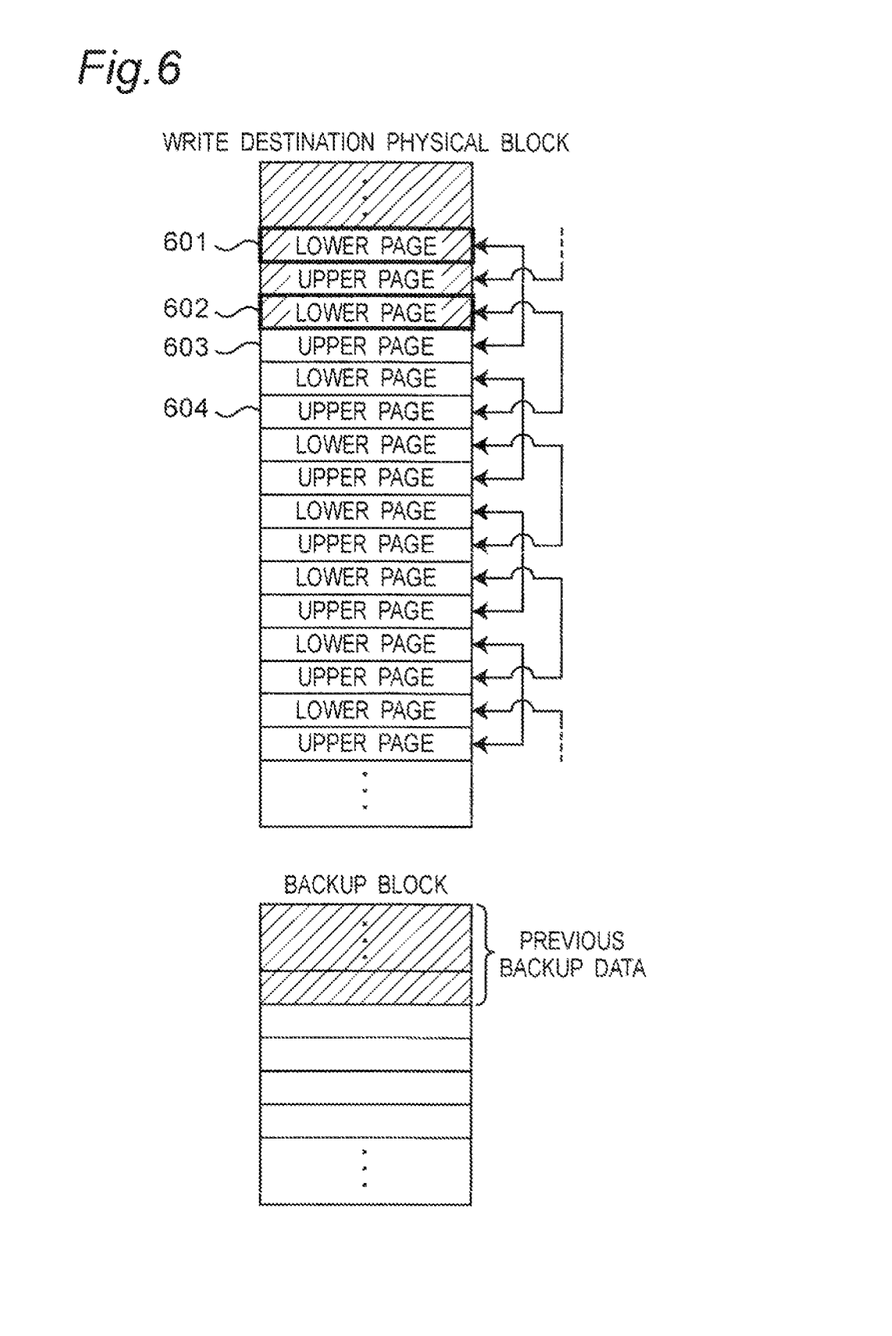
FIG. 6 is a view showing a state of a physical block serving as a write destination in the nonvolatile memory used in the nonvolatile memory device.

FIG. 6 shows the write destination physical block determined in step S501. Although the physical page number is not shown in FIG. 6, the physical page numbers are arranged from the page 0 in the ascending order as shown in FIG. 4. The physical pages in which data has been already written are hatched. The physical pages in which data is not written are not hatched. An arrow line shown on the right side of the write destination physical block shows a relationship of the pages sharing the multi-level cell like in FIG. 4. For example, in FIG. 6, a physical page 601 and a physical page 603 share the multi-level cell. In addition, a physical page 602 and a physical page 604 share the multi-level cell;

Here, it is assumed that data is written from a top page of the unwritten physical pages. In this case, as shown by arrow lines in FIG. 6, the third physical page 601 from the bottom of the already written physical pages shown with bold frame and the physical page 603 in which data is to be written correspond to the lower page and the upper page of the same memory cell, respectively and share the memory cell. In addition, the last physical page 602 of the already written physical pages shown with bold frame and the physical page 604 in which data is to be written correspond to the lower page and the upper page in the same memory cell, respectively and share the memory cell. The backup determination unit 110 stores information about such sharing relationship, and determines whether or not data has been already written in the lower page of the memory cell in the physical page in which the data is to be written, with reference to the above information.

In the case of shown in FIG. 6, when power shutdown occurs during writing the data to the physical page 603 or the physical page 604, there is a possibility that the data in the physical page 601 or the physical page 602 which shares the memory cell with the above physical page is destroyed. In this case, the backup determination unit 110 determines that the page which could be destroyed exists in step S502, and an operation moves to step S503.

Referring to FIG. 5 again, when the backup unit 111 determines that the written data could be destroyed, the data in the physical page which could be destroyed as described above is backed up to the backup block (S503). The backup block is provided in the flash memory 102 dedicated for the data backup. The backup process will be described in detail with reference to FIG. 7.

Figure 7:
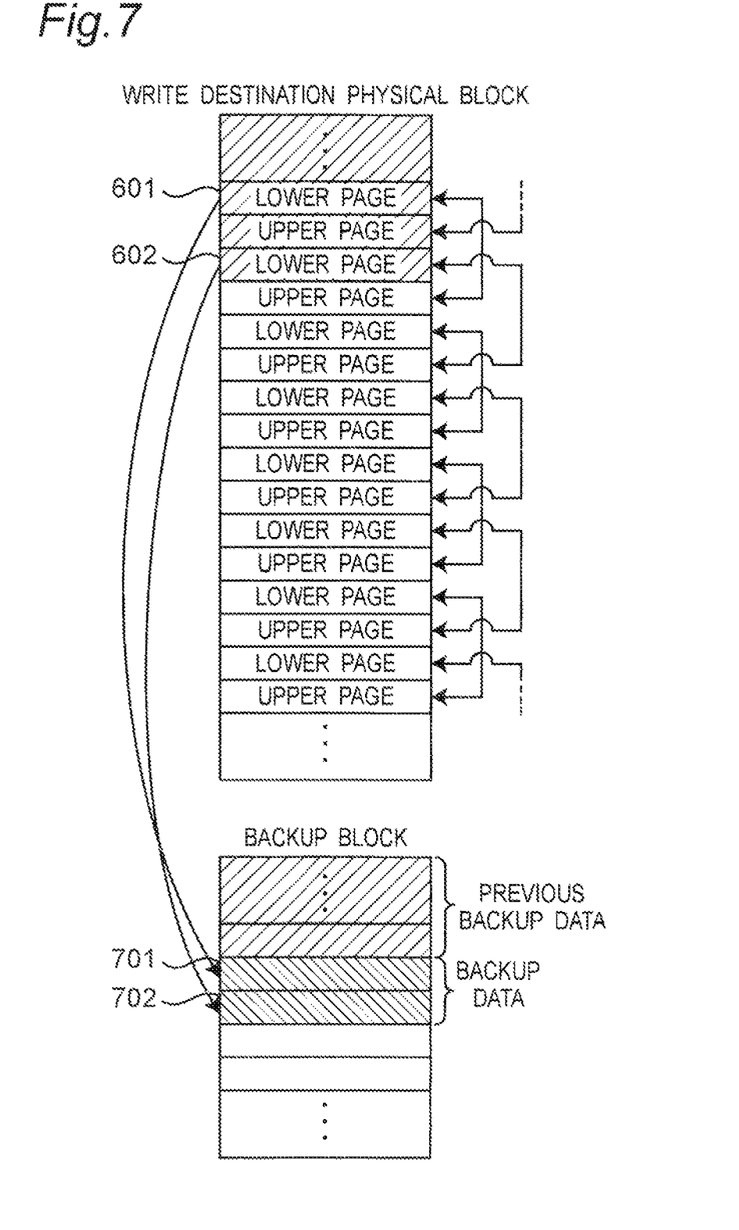
FIG. 7 is a view of backup of data in the nonvolatile memory used in the nonvolatile memory device.

FIG. 7 is a view to explain the data backup process in step S503. The control unit 104 reads the data which has been already written in the physical pages (physical page 601 and the physical page 602) which are determined to be backed up by the backup unit 111 in step S502. Then, the control unit 104 sequentially writes the data in the physical pages which have been determined to be backed up, in unwritten physical pages in the backup block from a physical page whose physical page number is the smallest therein. That is, the data is backed up. For example, in FIG. 7, the data is backed up by writing the data in a physical page 701 and a physical page 702. In addition, the physical page of the backup block for recording the data to be backuped is determined with reference to the backup management table 122. More specifically, with reference to the backup management table 122, the data to be newly backed up is recorded in a page next to the physical page having previous backup data. In the backup, the data which could be destroyed is temporarily backed up in the backup block. According to this embodiment, at the time of backup, the previous data is left as it is without being erased. Unless the failure such as the power shutdown occurs at the time of data writing, the backup data is no longer required. In the case where the failure occurs, a data recovery process (which will be described in detail below) is performed. The data which has been already written in the backup block is no longer used, so that there is no problem even when the data is destroyed at the time of the data backup. That is, the data which has been already written in the backup block is regarded as already written invalid data. Therefore, there is no problem even when the data is recorded with a multivalue in the multi-level cell in the backup block.

In addition, the memory controller 101 records information showing the physical page in the write destination physical block in which the backup data has been originally written, and information showing the physical page in which the data is copied in the backup block, in the backup management table 122.

Referring to FIG. 5 again, after the backup of the data in step S503, the memory controller 101 controls the write unit 108 to sequentially write the write data from the host device 103, to the physical pages from the physical page 603 whose page number is the smallest in the unwritten physical pages (S504). Alternatively, the memory controller 101 sequentially writes previously copied data for writing the write data from the host device 103, from the physical page 603 (S504). This process will be described in detail with reference to FIG. 8.

Figure 8:
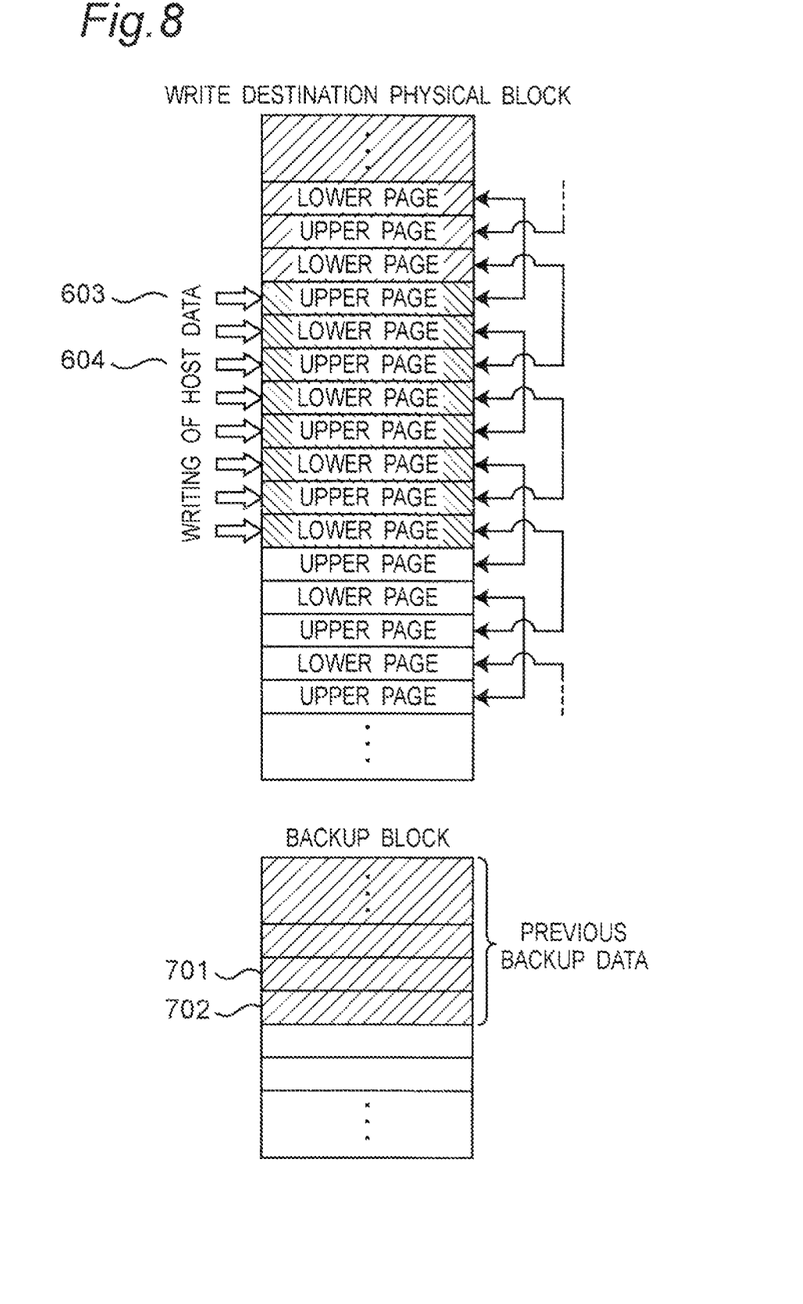
FIG. 8 is a view showing that host data has been written in the nonvolatile memory used in the nonvolatile memory device.

FIG. 8 shows the write process of the data in step S504. The memory controller 101 controls the write unit 108 to sequentially write the write data from the host device 103 to the physical pages from the physical page 603 which is a top page of the unwritten physical pages. The memory controller 101 updates the write management table 121 after all data has been normally written. More specifically, the memory controller 101 updates the information showing the last physical page in which the data is written in the write destination physical block (hereinafter, referred to as the "write control information"), in the write management table 121.

FIG. 8 shows a state after the write operation for all of the write data from the host device 103 (hereinafter, referred to as the "host data" occasionally) has been finished, and the write management table 121 has been updated. The previous backup data includes the physical page 701 and the physical page 702 in the backup block. After the update of the write management table 121 has been correctly finished, the data backed up in the backup block in step S503 becomes invalid data which is no longer used.

In addition, the data is written to the physical block storing the write management table 121 as two-value information or in a multiplexing way. Thus, the write control information recorded in the write management table 121 is protected so as not to be damaged by the power shutdown.

Referring to FIG. 5 again, after the process in step S504, it is determined whether there is unwritten data or not (S505), and when there is unwritten data, the process moves back to step S501 and the process is continued (return to step S501). When there is no unwritten data, the write process of the flowchart in FIG. 5 is completed.

The data is written to the write destination physical block in step S504 in the flowchart in FIG. 5, and it is not likely that the already written valid data in the write destination physical block is destroyed in the processes from step S501 to step S503. In addition, when the already written valid data in the write destination physical block could be destroyed due to power shutdown while the data is written to the memory cell shared with the already written data, the already written data which could be destroyed is backed up in step S503. Therefore, the already written valid data can be prevented from being destroyed due to the power shutdown during writing the data.

Hereinafter, a description will be made of a backup process of the in the case where the failure such as the power shutdown occurs during writing the data. When the power shutdown occurs during writing the data in step S504, the memory controller 101 acquires, just after power resupply, the write control information showing the last physical page of the data written in the write destination physical block, with reference to the write management table 121 of the flash memory 102.

Figure 9:
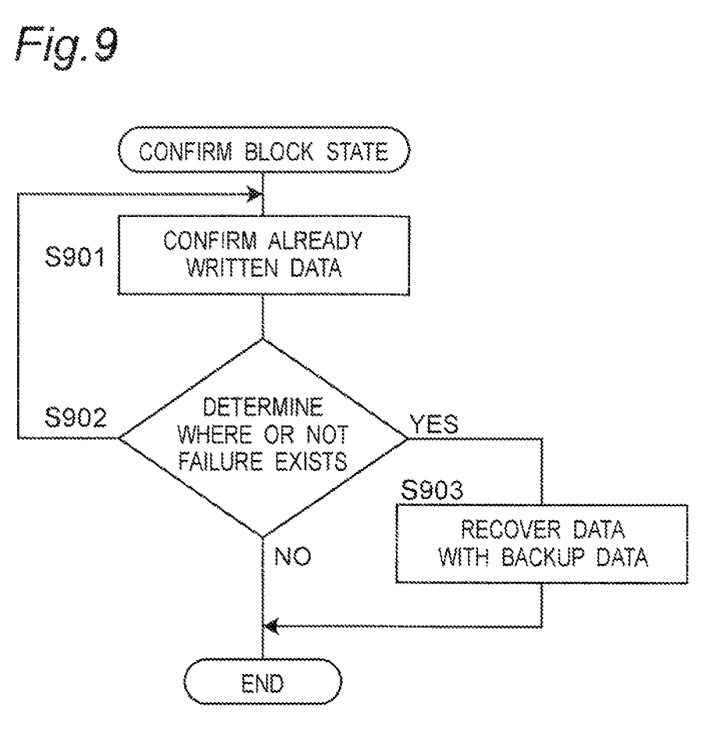
FIG. 9 is a flowchart to confirm a block state in the nonvolatile memory device.

FIG. 9 shows a flowchart of a process to confirm a state of the write destination physical block after acquiring the write control information.

First, the memory controller 101 confirms the already written data (S901). More specifically, the memory controller 101 reads the write control information showing the "physical page in which the data is lastly written in the destination physical block", with reference to the write management table 121.

Next, the memory controller 101 controls the failure determination unit 112 to determine whether or not there is a failure (S902). More specifically, as a first step, the memory controller 101 accesses a physical page next to the last written physical page, based on the write control information read in step S901, and confirms a write state of this physical page.

Then, as a second step, the memory controller 101 determines whether or not there is a failure in writing, based on the confirmed write state of the accessed physical page. More specifically, when the write state of the accessed physical page is in an unwritten state, the memory controller 101 determines that writing the data has been normally completed and there is no failure. Meanwhile, when the write state of the accessed physical page is not in the unwritten state, the memory controller 101 determines that the writing data is not normally completed and there is a failure.

The reason why the above determination can be made is as follows. That is, when the write control information is correctly written in the write management table 121 and then the write management table 121 is updated after the data is written in the write destination physical address, the physical page accessed based on the write control information is to be in the unwritten state. However, it is not in the unwritten state in the following case. That is, (1) when the power shutdown occurs during writing the data in the middle page of the plurality of write target physical pages and the write management table 121 is not updated, and (2) when the power shutdown occurs in the middle of updating the write management table 121 and the write management table 121 is not correctly updated although the data has been written in the all of the write target physical pages. In either case, the write management table 121 is not normally updated, so that the write control information of the write management table 121 does not coincide with the actual write state in the physical page. Therefore, when the write state of the physical page accessed based on the write control information is in the written state, it is determined that there is a failure, and when the write state is in the unwritten state, it is determined that there is no failure.

When it is determined that there is no failure in step S902, the processes after step S901 are repeated. Meanwhile, when it is determined that there is a failure in step S902, a recovery process is performed based on the backup data (S903). The recovery process will be described in detail with reference to FIG. 10.

Figure 10:
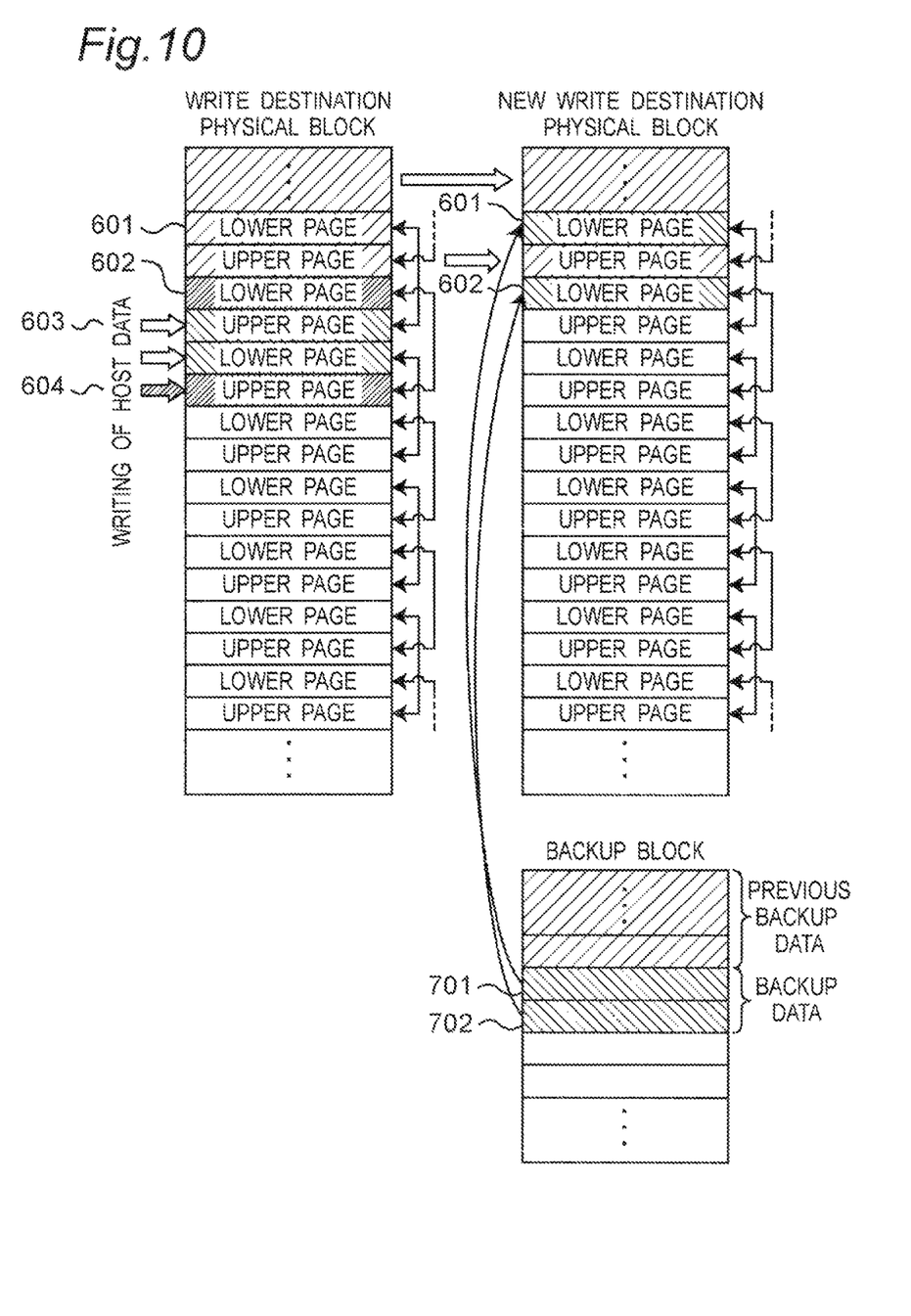
FIG. 10 is a view showing that a recovery process has been performed in the nonvolatile memory used in the nonvolatile memory device.

FIG. 10 shows a state of the write destination physical block in the case where the power shutdown has occurred before all of the host data is completely written (during writing data) in writing the host data in step S504 shown in FIG. 5. More specifically, FIG. 10 shows a state in the case where the power shutdown has occurred during writing the data to the physical page 604 shown by slanting lines. When the power is shut down while the data is written to the physical page 604, the data in the physical page 602 which shares the multi-level cell with the physical page 504 and is shown by the same slanting lines could be destroyed. When the data is destroyed, the control unit 104 reads the data backed up in the backup block and performs the recovery process, with reference to the backup management table 122. When the recovery process is performed, an already erased physical block is defined as a new write physical block. More specifically, the control unit 104 copies the data in the physical page already written in the write destination physical block except for the data in the physical page backed up in the backup block, and the data in the physical page backed up in the backup block, to the new write destination physical block. Thus, the control unit 104 redefines the new write destination physical block as the write destination physical block and updates the write management table 121.

By the above recovery process, the data in the lower page destroyed during writing the data to the multi-level cell can be recovered. That is, the state of the write destination physical block can be restored to the state before the host data is written.

In addition, while the failure determination unit 112 determines whether or not there is a failure, based on the write control information in the write management table 121 and the write state in the actual physical page in the above embodiment, the determination may be performed, based on whether or not the error correction can be performed in the physical page.

3. Conclusion

According to this embodiment, when the write destination physical address corresponds to the upper page, and data has been already written in the lower page in the multi-level cell, the already written data is copied to the nonvolatile storable backup region. In this configuration, even when a failure such as power shutdown occurs during writing the data in the flash memory 102 including the multi-level cells, the already written data copied in the backup region remains in the backup region. As a result, the already written data can be recovered from the backup region. Therefore, the data reliability can be improved.

In addition, while the description has been made of the case where the multi-level cell can store the two-bit data in this embodiment, the technical idea in this embodiment can be applied to a case where the multi-level cell can store data of three bits or more. For example, in a case where the multi-level cell can store three-bit (three-page) data, when data is newly written in a third page under the condition that the data has been written in first and second pages, or when data is newly written to the second page under the condition that data has been written only in the first page, the above-described backup may be performed for the corresponding page of the memory cell.

INDUSTRIAL APPLICABILITY

Regarding the nonvolatile memory device and the memory controller according to the present invention, similar to the multivalued NAND flash memory, reliability is improved in a memory device such as a nonvolatile memory in which each memory cell holds data of a plurality of pages. The present invention can be applied to a portable AV equipment such as a still image record/reproduce device and a moving image record/reproduce device, and a recording medium of a portable communication device such as a mobile phone.

What is claimed is:

1. A memory controller for writing and reading data to and from a nonvolatile memory, wherein
the nonvolatile memory has a plurality of memory cell blocks,
each memory cell block includes a plurality of multi-level cells each capable of storing 2-bit data,
a lower page and an upper page are respectively allocated to the 2 bits of the multi-level cell,
the memory controller sequentially writes the data to the memory cells starting from the lower page of the multi-level cell, and comprises a backup unit, and
when a write command is received from the outside of the memory controller, in a case where (i) a data write destination of data to be written is the upper page of the multi-level cell and (ii) data is already written in the lower page of the multi-level cell, the backup unit backs up the data that is already written in the lower page of the multi-level cell to a nonvolatile storable backup region before writing the data to be written to the upper page of the multi-level cell.

2. The memory controller according to claim 1, wherein
the respective pages of the respective memory cells composing the memory cell block are arranged in a predetermined order to constitute a plurality of physical pages,
the memory controller writes data to the physical pages in a write destination memory cell block in the predetermined order, and
after the backup unit backs up the data that is already written in the lower page of the multi-level cell to a nonvolatile storable backup region, the memory controller (i) writes the data to be written to the upper page of the multi-level cell and (ii) records, in a write management table, information showing the last physical page of the data that is already written in the lower page of the multi-level cell in the write destination memory cell block.

3. The memory controller according to claim 2, further comprising a failure determination unit operable to detect a failure occurring during writing data in the nonvolatile memory, by comparing information of the write management table with information of write state of the physical page corresponding to a physical address of the data write destination.

4. The memory controller according to claim 3, further comprising a recovery unit operable to recover the data to which the failure occurs during writing data, by using the backed up data to the backup region when a failure occurring during writing the data is detected by the failure determination unit.

5. The memory controller according to claim 4, wherein
the memory controller records information showing a backup source physical page from which the data is backed up to the backup region, and information showing a backup destination physical page in the backup region to which the data is backed up, in a backup management table.

6. The memory controller according to claim 5, wherein the recovery unit
newly sets a new write destination block for recovery,
for the data not backed up in the backup region in the data written in the write destination physical block, reads the data from the write destination physical block and copies the read data to a corresponding physical page in the new write destination physical page, and
for the data backed up in the backup region, reads the backed up data from the backup region with reference to the backup management table and copies the read data to a corresponding physical page in the new write destination physical block.

7. The memory controller according to claim 2, wherein the write management table is provided in the nonvolatile memory.

8. The memory controller according to claim 1, wherein the backup region is provided in the nonvolatile memory.

9. A nonvolatile memory device comprising the memory controller according to claim 1, and a nonvolatile memory, wherein data can be read and written by a command designating an address from a host device provided outside the memory controller.

10. A nonvolatile memory device comprising the memory controller according to claim 2, and a nonvolatile memory, wherein data can be read and written by a command designating an address from a host device provided outside the memory controller.

11. A nonvolatile memory device comprising the memory controller according to claim 3, and a nonvolatile memory, wherein data can be read and written by a command designating an address from a host device provided outside the memory controller.

12. A nonvolatile memory device comprising the memory controller according to claim 4, and a nonvolatile memory, wherein data can be read and written by a command designating an address from a host device provided outside the memory controller.

13. A nonvolatile memory device comprising the memory controller according to claim 5, and a nonvolatile memory, wherein data can be read and written by a command designating an address from a host device provided outside the memory controller.

14. A nonvolatile memory device comprising the memory controller according to claim 6, and a nonvolatile memory, wherein data can be read and written by a command designating an address from a host device provided outside the memory controller.

15. A nonvolatile memory device comprising the memory controller according to claim 7, and a nonvolatile memory, wherein data can be read and written by a command designating an address from a host device provided outside the memory controller.

16. A nonvolatile memory device comprising the memory controller according to claim 8, and a nonvolatile memory, wherein data can be read and written by a command designating an address from a host device provided outside the memory controller.

* * * * *